(12) United States Patent
Tuma

(10) Patent No.: US 7,890,219 B2
(45) Date of Patent: Feb. 15, 2011

(54) COOLING FAN WITH SPEED MAINTAINED DURING WAIT PERIOD DESPITE DECREASING TEMPERATURE

(75) Inventor: George Tuma, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 306 days.

(21) Appl. No.: 12/205,725

(22) Filed: Sep. 5, 2008

(65) Prior Publication Data

US 2010/0008037 A1    Jan. 14, 2010

Related U.S. Application Data

(60) Provisional application No. 61/079,048, filed on Jul. 8, 2008.

(51) Int. Cl.
*G05D 23/00* (2006.01)
(52) U.S. Cl. .......................... 700/300; 700/306

(58) Field of Classification Search ............. 700/299, 700/300, 306
See application file for complete search history.

(56) References Cited

U.S. PATENT DOCUMENTS

| 5,526,289 | A | 6/1996 | Dinh |
| 5,574,667 | A | 11/1996 | Dinh et al. |
| 5,848,282 | A | 12/1998 | Kang |
| 6,181,556 | B1 * | 1/2001 | Allman ...................... 361/690 |
| 6,259,172 | B1 | 7/2001 | Lee |
| 6,400,045 | B1 | 6/2002 | Hosokawa et al. |
| 6,654,894 | B2 | 11/2003 | Kaminski |
| 7,233,121 | B2 | 6/2007 | Wu et al. |
| 2007/0297893 | A1 * | 12/2007 | Alon et al. ................. 415/47 |
| 2009/0092261 | A1 * | 4/2009 | Bard .......................... 381/71.1 |

* cited by examiner

*Primary Examiner*—Ryan A Jarrett

(57) ABSTRACT

A controller controls fan speed as a function of temperature indications. The controller maintains a constant fan speed despite indications of decreasing temperature at least until a preset wait period has expired since the last fan-speed change.

20 Claims, 1 Drawing Sheet

COOLING FAN WITH SPEED MAINTAINED DURING WAIT PERIOD DESPITE DECREASING TEMPERATURE

CROSS-REFERENCE TO RELATED APPLICATION

This application claims the benefit of Provisional Patent Application No. 61/079,048, filed Jul. 8, 2008, and titled, "Computer Fan With Speed Maintained During Wait Period Despite Decreasing Temperature", the entirety of which is hereby incorporated by reference herein.

BACKGROUND OF THE INVENTION

This application claims the benefit of the Jul. 8, 2008 filing date of provisional patent application Ser. No. 61/079,048.

Data processors, even more than most computer components, typically generate excessive heat during operation. If allowed to accumulate, the heat can impair, damage, and/or destroy the data processors; in addition, the heat can pose problems for user safety and comfort. Accordingly, a heat sink is typically used to conduct heat away from the processor and radiate it into the surrounding air. A fan is typically used to dissipate the air from the vicinity of the processor so that the heat sink can continue to cool the processor efficiently.

However, not only do the fans consume power and dissipate heat themselves, but they also generate noise that can negatively impact the user experience. For this reason, fans are often controlled as a function of the processor's temperature so that they are operational when needed and their speed of operation is not much more than needed for cooling purposes.

So that the fan is not constantly accelerating and decelerating, some hysteresis is built into the control method for the fan. In other words, for any given fan speed, the threshold temperature for ramping up the fan speed is higher than the threshold for ramping down the fan speed. However, despite these measures, fan activity can negatively impact the user experience and a solution is needed that reduces this negative impact.

BRIEF DESCRIPTION OF THE DRAWINGS

The features and advantages of the invention as well as additional features and advantages thereof will be more clearly understood hereinafter as a result of a detailed description of a preferred embodiment of the invention when taken in conjunction with the following drawings in which.

DETAILED DESCRIPTION

Figure 1:
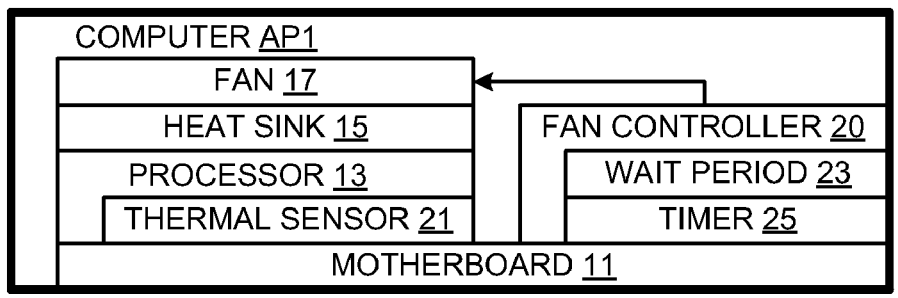
FIG. 1 is a schematic diagram of a computer system in accordance with an embodiment of the invention.

In the course of the present invention, while a user can acclimate to a fan operating a constant speed, frequent changes in speed can degrade the user experience of a computer (e.g., excessive and irregular noise). While hysteresis removes some speed changes, the remaining speed changes can be annoying due to the associated changes in noise levels. To further limit changes in fan speed, the invention provides for a wait period that must lapse before speed can be decreased. In general, the wait is not imposed for speed increases. Although the wait is imposed only for decreases, the effect is to reduce the frequency of rate increases and decreases, and thus to improve the user experience.

In accordance with an embodiment of the invention, a computer AP1 includes a motherboard 11, a processor 13, a heat sink 15, a variable-speed fan 17, and a fan controller 20. Processor 13 includes a thermal sensor 21 that provides digital data to fan controller 20 via motherboard 11. This permits fan controller 20 to monitor the temperature of processor 13.

Figure 2:
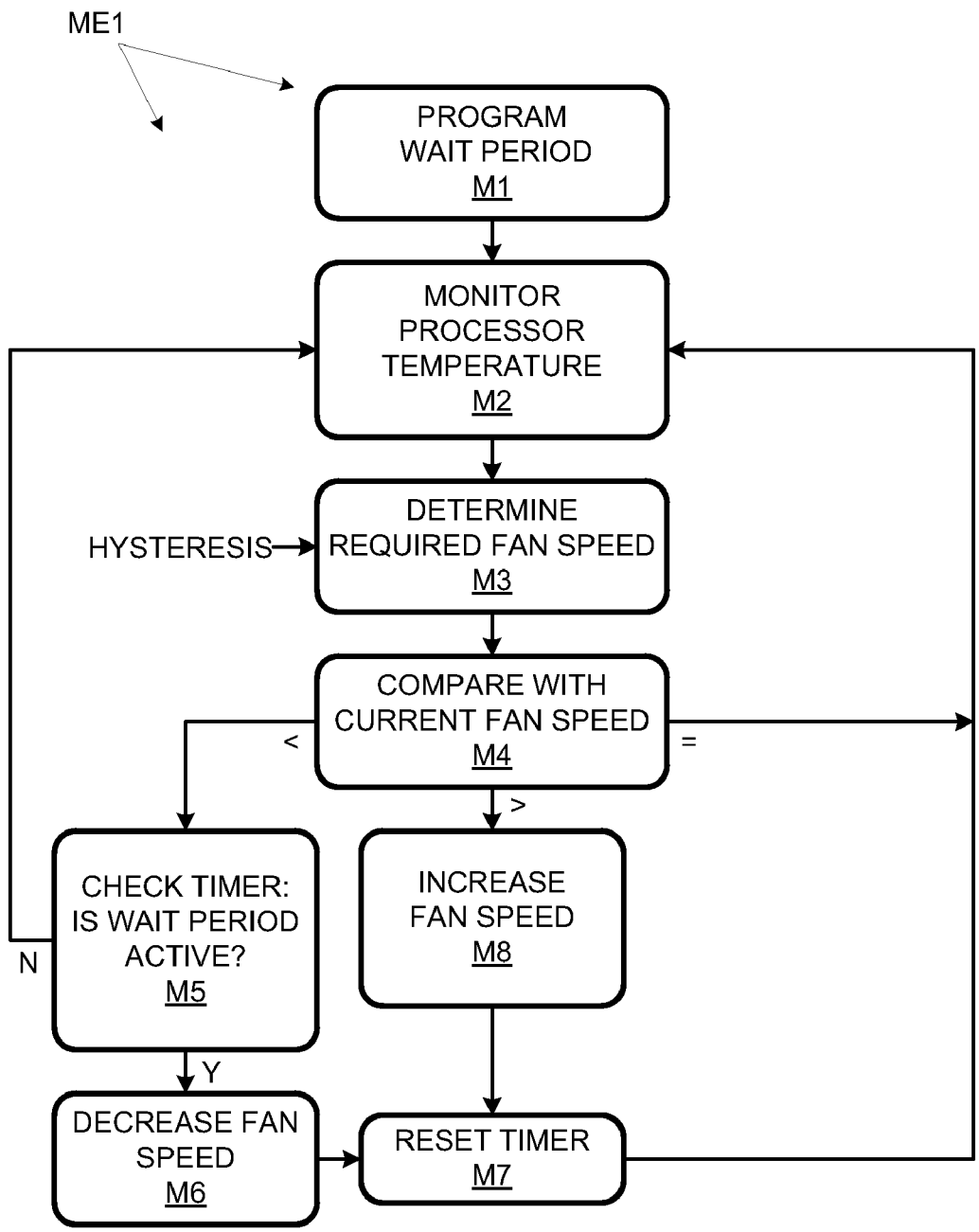
FIG. 2 is a flow chart of a method in accordance with an embodiment of the invention.

Fan controller 20 uses the data from thermal sensor 21 to control fan 17 so that it runs fast enough to remove heat adequately, but allows for slower speeds or a power-off state while the demands for airflow are reduced. Fan speed is not necessarily changed when the processor's temperature changes. Whether or not hysteresis is also applied, the fan speed changes are limited by imposing a wait period 23 since the last fan speed change on a decrease in the fan speed. Controller 20 includes a timer 23 for keeping track of this wait period 23. A method ME1 employed by controller 20 to control fan 17 is represented in the flow chart of FIG. 2.

At step M1, controller 20 is programmed with a wait period 23. In an alternative embodiment, the wait period is fixed; in another alternative embodiment, the wait period is set automatically. In the present case, the wait period can be set anywhere from 0 seconds to ten minutes. Preferably, the wait period is at least 10 seconds, with wait periods of one to five minutes generally providing a good user experience, yet allowing fan 17 to operate at low speed or be turned off when the demands for cooling are maintained at a low level.

At step M2, the temperature of processor 13 is monitored. To this end, controller 20 tracks the readings provided by sensor 21. Although these readings are provided at discrete times, the periodicity of the readings is high enough, e.g., once per second, relative to the rate at which processor temperature typically changes that they are effectively continuous. In an alternative embodiment, longer periods are allowed between readings, e.g., once every five seconds.

At step M3, controller 20 determines a required fan speed, in other words, a speed at which fan 17 is to operate given the current temperature level and direction of change. The direction of change is used to select one of two functions for calculating required fan speed as a function of processor temperature so as to implement hysteresis. Thus, once the fan speed has risen to a certain level in response to increasing temperatures, the processor temperature must fall by a predetermined significant amount before fan speed is decreased. Also, if the fan speed has decreased to a certain level in response to falling processor temperatures, the processor temperature must rise by a predetermined significant amount before fan speed is increased. In an alternative embodiment, hysteresis is not employed.

At step M4, the required fan speed is compared to the current fan speed. (Controller 20 determines the current fan speed and thus knows what it is.) Three possible outcomes are distinguished: the required fan speed may be 1) greater, 2) less than, or 3) equal to the current fan speed.

If at step M4, it is determined that the required fan speed is less than the current fan speed, controller 20 checks timer 25 to determine if the programmed wait period 23 is active or has expired at step M5. If a wait period is active, method ME1 returns to monitoring step M2. If, at step M5, it is determined that the most-recent wait period has expired, fan speed is decreased to the required fan speed at step M6. In that case, timer 25 is reset at step M7. At this point, method ME1 returns to monitoring step M2. Alternatively, controller 20 can be programmed so that method ME1 returns to step M2 from step M6 without resetting timer 25. This latter mode allows fan speed to fall more quickly, but results in more extended fan speed decreases.

If at step M4, it is determine that the required fan speed is greater than the current fan speed, controller 20 increases the fan speed to the required fan speed at step M8. At step M7, controller 20 resets timer 25. Method ME1 then returns to monitoring step M2. If at step M4, it is determined that the required fan speed is equal to the current fan speed, method ME1 returns to monitoring step M2 without changing the fan speed or resetting timer 25.

Method ME1 provides for alternative modes of operation. In a first mode, the wait period is reset each time the fan speed is changed, whether that change involves a fan-speed increase or a fan-speed decrease. In a second mode, the wait period is reset when the fan speed is increased but not when it is decreased. The second mode better ensures a minimum wait period between speed changes, but can cause more speed changes during a prolonged decrease in processor temperature.

The present invention provides for inhibiting downward fan-speed changes during a wait period. While the same delay is not applied to fan-speed increases, the result is that many increases in processor temperature that would otherwise require an increase in fan speed do not require an increase in fan speed when the invention is practiced. For example, if, during a wait period, processor temperature decreases and then increases to a level for which the current fan speed is sufficient, the fan speed will not change (until the wait period is over) even though the processor temperature increases. On the other hand, the fan speed will increase whenever the processor temperature increases to a level for which the current fan speed is insufficient for cooling purposes. In summary, the invention provides for prompt responses whenever a higher fan speed is required, but generally provides for a comfortably long duration between transitions in fan speed to improve the user's experience with the incorporating computer.

It is noted that hysteresis also reduces the number of fan-speed transitions. However, since it is temperature-based rather than time-based, it is less well suited to establishing transition-free intervals of a given minimum duration. While the preferred embodiment provides for using it along with a wait period, the wait period makes hysteresis somewhat redundant.

The foregoing description, for purposes of explanation, has been described with reference to specific embodiments. However, the illustrative discussions are not intended to be exhaustive or to limit the invention to the precise forms disclosed. Many modifications and variations are possible in view of the disclosed teachings. The embodiments were chosen and described in order to best explain the principles of the invention and its practical applications, to thereby enable others skilled in the art to best utilize the invention and various embodiments with various modifications as are suited to the particular use contemplated.

While the present invention has been described in the context of a fan mounted on a heat sink mounted on a processor, the invention also applies to fans mounted on other heat-generating components as well. For example, graphics cards, graphics processors (GPUs), and voltage regulators are examples of products that dissipate a lot of heat and need commensurate cooling measures. Such components can use heat sinks and fans and can take advantage of the present invention. Also, fans that are not tied to particular components, e.g., intake and exhaust fans for a computer enclosure, can be operated in accordance with the present invention.

Also, non-computer devices that require fan speed to be regulated according to temperature can benefit from the present invention; for example, the invention can apply to power supply units in various consumer appliances as well as in personal computers. Generally, the invention provides advantages in applications involving active air cooling. These and other variations upon and modifications to the illustrated embodiments are provided for by the present invention, the scope of which is defined by the following claims.

What is claimed is:

1. A system comprising:
   a fan having a variable fan speed;
   a thermal sensor for providing temperature indications;
   a timer for indicating whether a preset wait period since a last fan-speed change is active or has expired;
   a controller communicatively coupled to said sensor for controlling said fan speed at least in part in response to changes in said temperature indications, said controller, in response to said temperature indications indicating said fan speed can be reduced, determining whether to maintain or decrease said fan speed based on whether said wait period is active or has expired.

2. A system as recited in claim 1 wherein said controller maintains said fan speed while said preset wait period since the last speed increase is active.

3. A system as recited in claim 1 wherein said controller maintains said fan speed while said preset wait period since the last speed decrease is active.

4. A system as recited in claim 1 wherein said wait period is at least 10 seconds.

5. A system as recited in claim 1 further comprising a data processor.

6. A system as recited in claim 5 wherein said data processor includes said thermal sensor.

7. A system as recited in claim 5 further comprising a heat sink mounted on said processor.

8. A system as recited in claim 7 wherein said fan is mounted on said heat sink.

9. A system as recited in claim 1 wherein said controller is programmable so that said wait period can be selected by a user.

10. A system as recited in claim 1 wherein said controller applies hysteresis in addition to said wait period in controlling said fan speed.

11. A system as recited in claim 1 further comprising a computer processor including said thermal sensor and said time.

12. A system as recited in claim 11 further comprising a heat sink mounted on said processor and on which said fan is mounted.

13. A method comprising:
   monitoring a temperature level and a direction of temperature change to provide temperature indications;
   determining a required fan speed for a fan at least in part as a function of said temperature indications;
   comparing said required fan speed with a current fan speed of said fan;
   if said required fan speed equals said current fan speed, maintaining said current fan speed;
   if said required fan speed is greater than said current fan speed, increasing said fan speed to said required fan speed;
   if said required fan speed is less than said current fan speed, determining whether to maintain or decrease said fan speed based on whether a wait period since a last fan-speed change is active or has expired; and if said wait period is active, maintaining said current fan speed, and if said wait period has expired, decreasing said fan speed.

14. A method as recited in claim 13 wherein, if said fan speed is greater than said current fan speed, increasing said fan speed to said required speed even if said wait period is active.

15. A method as recited in claim 13 wherein said wait period is reset when said fan speed is increased.

16. A method as recited in claim 15 wherein said wait period is reset when said fan speed is decreased.

17. A method as recited in claim 13 wherein said sensor is integrated into a processor.

18. A method as recited in claim 17 wherein said fan is mounted on a heat sink mounted on said processor.

19. A method as recited in claim 17 wherein said temperature indications are provided by said processor to a controller external to said processor.

20. A method as recited in claim 13 wherein said wait period is at least 10 seconds.

* * * * *

UNITED STATES PATENT AND TRADEMARK OFFICE
CERTIFICATE OF CORRECTION

| | | |
|---|---|---|
| PATENT NO. | : 7,890,219 B2 | Page 1 of 1 |
| APPLICATION NO. | : 12/205725 | |
| DATED | : February 15, 2011 | |
| INVENTOR(S) | : George Tuma | |

It is certified that error appears in the above-identified patent and that said Letters Patent is hereby corrected as shown below:

In column 1, line 54, delete "invention," and insert -- invention. --, therefor.

In column 4, line 48, in Claim 11, delete "time." and insert -- timer. --, therefor.

Signed and Sealed this
Twelfth Day of July, 2011

David J. Kappos
*Director of the United States Patent and Trademark Office*